(12) United States Patent
Wang et al.

(10) Patent No.: US 10,510,679 B2
(45) Date of Patent: Dec. 17, 2019

(54) SEMICONDUCTOR DEVICE WITH SHIELD FOR ELECTROMAGNETIC INTERFERENCE

(71) Applicant: Taiwan Semiconductor Manufacturing Company, Ltd., Hsinchu (TW)

(72) Inventors: Chuei-Tang Wang, Taichung (TW); Chen-Hua Yu, Hsinchu (TW); Wei-Ting Chen, Tainan (TW); Chieh-Yen Chen, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/801,218

(22) Filed: Nov. 1, 2017

(65) Prior Publication Data

US 2019/0006288 A1 Jan. 3, 2019

Related U.S. Application Data

(60) Provisional application No. 62/527,879, filed on Jun. 30, 2017.

(51) Int. Cl.
| | |
|---|---|
| *H01L 23/552* | (2006.01) |
| *H05K 1/18* | (2006.01) |
| *H05K 3/32* | (2006.01) |
| *H01L 21/56* | (2006.01) |
| *H01L 21/52* | (2006.01) |
| *H01L 23/31* | (2006.01) |
| *H01L 25/00* | (2006.01) |
| *H01L 25/07* | (2006.01) |

(52) U.S. Cl.
CPC .......... *H01L 23/552* (2013.01); *H01L 25/071* (2013.01); *H01L 25/50* (2013.01)

(58) Field of Classification Search
CPC . H01L 21/561; H01L 23/3114; H01L 23/552; H01L 23/64; H01L 25/16; H01L 2224/73265; H01L 2924/01078; H01L 2924/01079; H01L 2924/01322; H01L 2924/13091
See application file for complete search history.

(56) References Cited

U.S. PATENT DOCUMENTS

| 6,492,194 B1 | 12/2002 | Bureau et al. |
| 2007/0045814 A1 | 3/2007 | Yamamoto et al. |
| (Continued) | | |

FOREIGN PATENT DOCUMENTS

| KR | 20140111936 A | 9/2014 |
| KR | 20160123959 A | 10/2016 |
| (Continued) | | |

*Primary Examiner* — Brian Turner
(74) *Attorney, Agent, or Firm* — Slater Matsil, LLP

(57) ABSTRACT

A semiconductor device includes a first die embedded in a molding material, where contact pads of the first die are proximate a first side of the molding material. The semiconductor device further includes a redistribution structure over the first side of the molding material, a first metal coating along sidewalls of the first die and between the first die and the molding material, and a second metal coating along sidewalls of the molding material and on a second side of the molding material opposing the first side.

20 Claims, 15 Drawing Sheets

(56) References Cited

U.S. PATENT DOCUMENTS

| | | | |
|---|---|---|---|
| 2009/0194851 A1* | 8/2009 | Chiu | H01L 21/568 257/660 |
| 2009/0212401 A1* | 8/2009 | Do | H01L 21/56 257/659 |
| 2010/0006988 A1* | 1/2010 | Tang | H01L 21/6835 257/659 |
| 2011/0115060 A1 | 5/2011 | Chiu et al. | |
| 2011/0298109 A1 | 12/2011 | Pagaila et al. | |
| 2011/0304011 A1* | 12/2011 | Lee | H01L 21/561 257/531 |
| 2012/0211876 A1* | 8/2012 | Huang | H01L 23/552 257/660 |
| 2013/0082364 A1* | 4/2013 | Wang | H01L 25/0655 257/659 |
| 2013/0207247 A1* | 8/2013 | Pagaila | H01L 21/565 257/659 |
| 2013/0328186 A1* | 12/2013 | Uzoh | H01L 21/76898 257/737 |
| 2014/0262475 A1 | 9/2014 | Liu et al. | |
| 2015/0279789 A1* | 10/2015 | Mahajan | H01L 23/552 257/659 |
| 2016/0093525 A1* | 3/2016 | Cook | H01L 21/4867 257/676 |
| 2016/0105966 A1* | 4/2016 | Tomikawa | H05K 3/4697 174/255 |
| 2016/0307788 A1 | 10/2016 | Hu et al. | |
| 2016/0329299 A1* | 11/2016 | Lin | H01L 23/5226 |
| 2017/0033062 A1 | 2/2017 | Liu et al. | |
| 2017/0047293 A1 | 2/2017 | Moon et al. | |
| 2017/0141056 A1* | 5/2017 | Huang | H01L 24/20 |
| 2017/0200702 A1* | 7/2017 | Hung | H01L 25/0657 |
| 2017/0223839 A1 | 8/2017 | Jain et al. | |

FOREIGN PATENT DOCUMENTS

| | | |
|---|---|---|
| KR | 20170019023 A | 2/2017 |
| TW | 200503126 A | 1/2005 |

\* cited by examiner

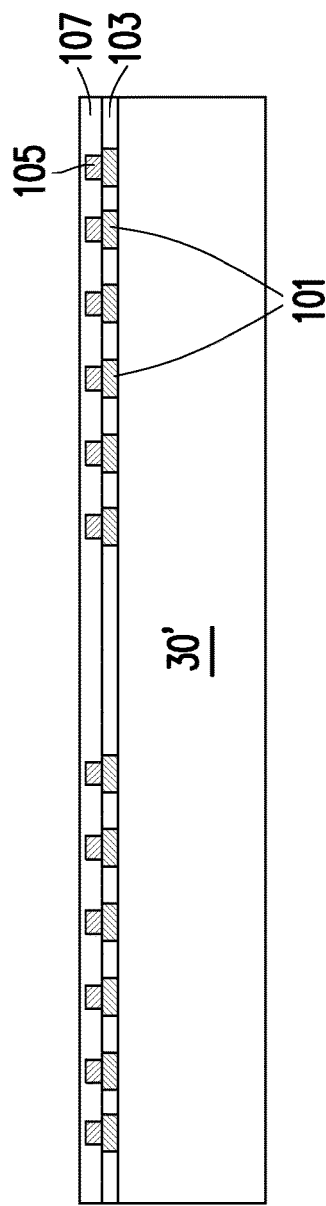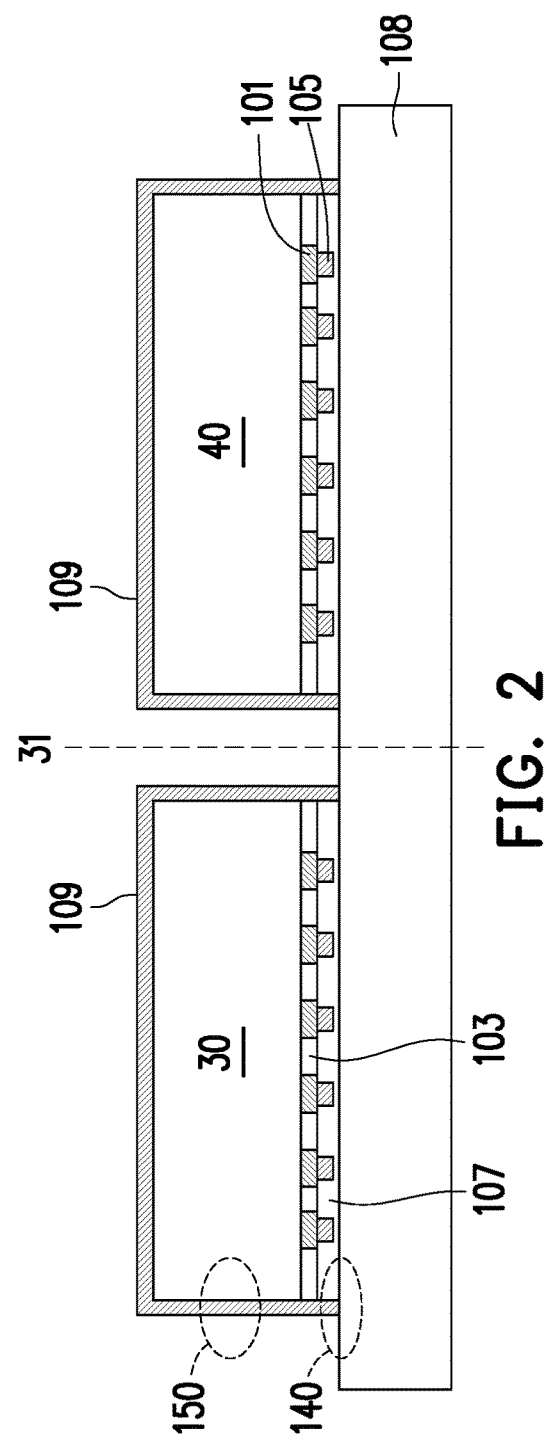

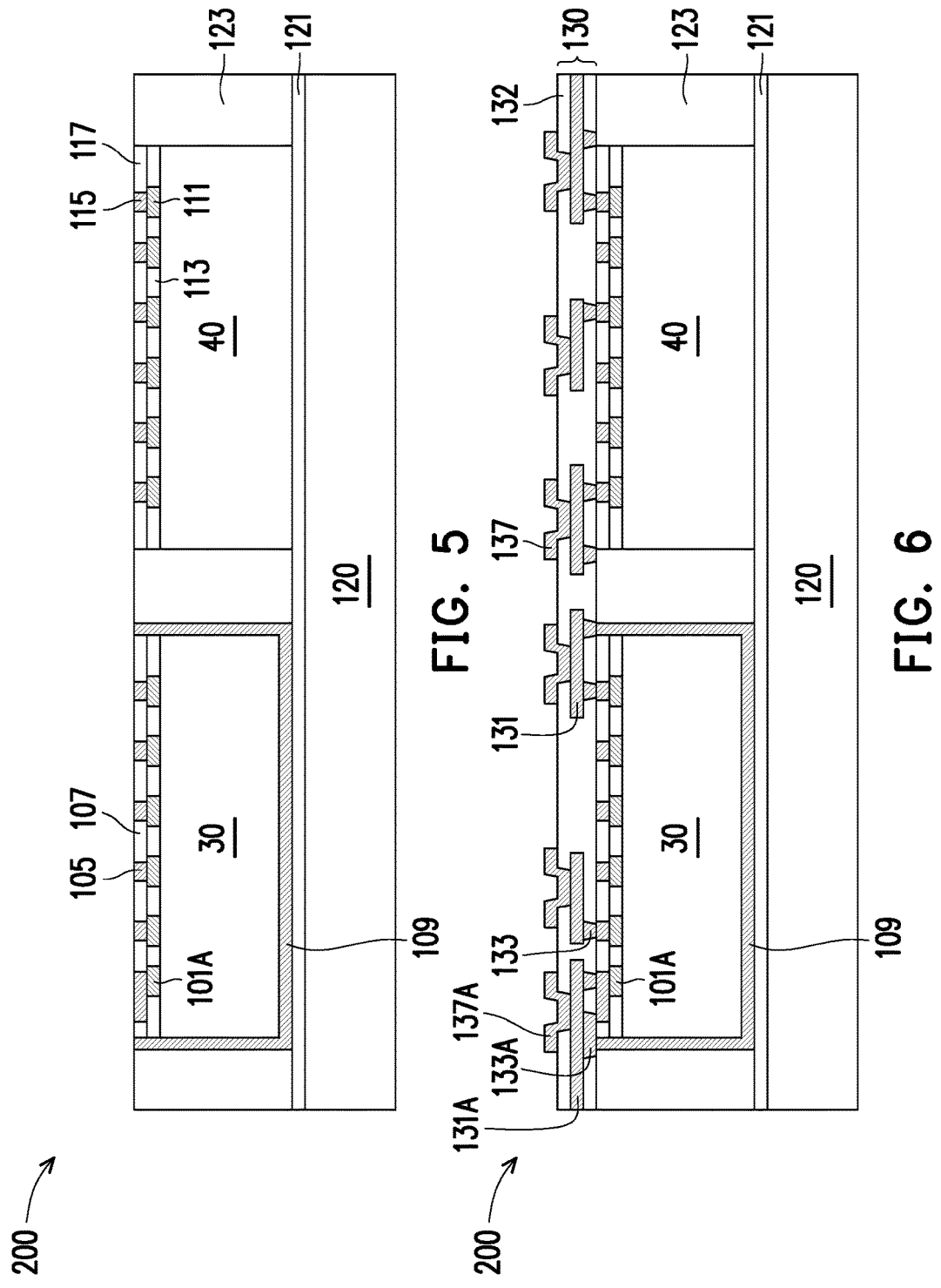

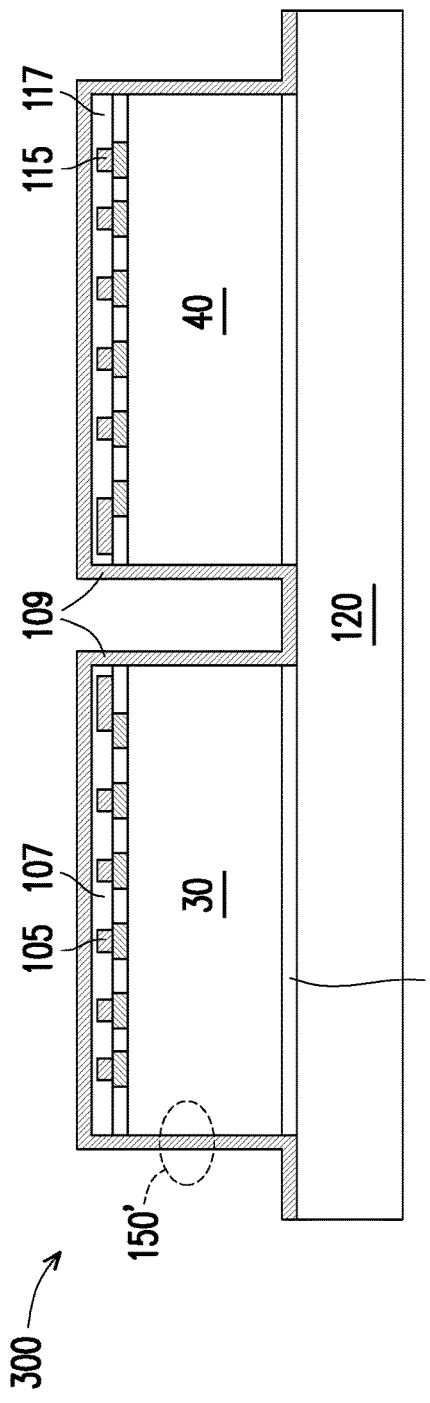
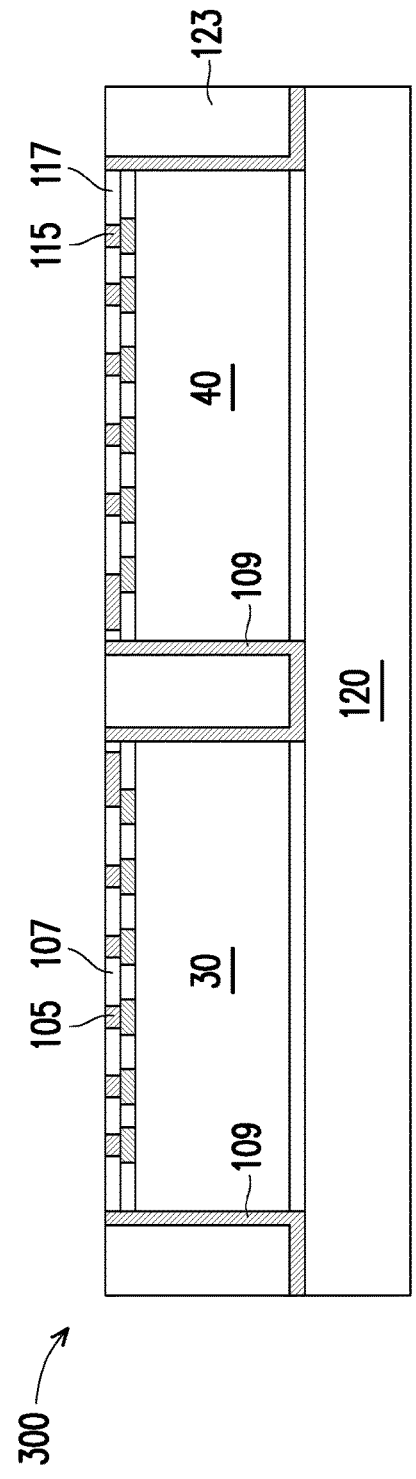

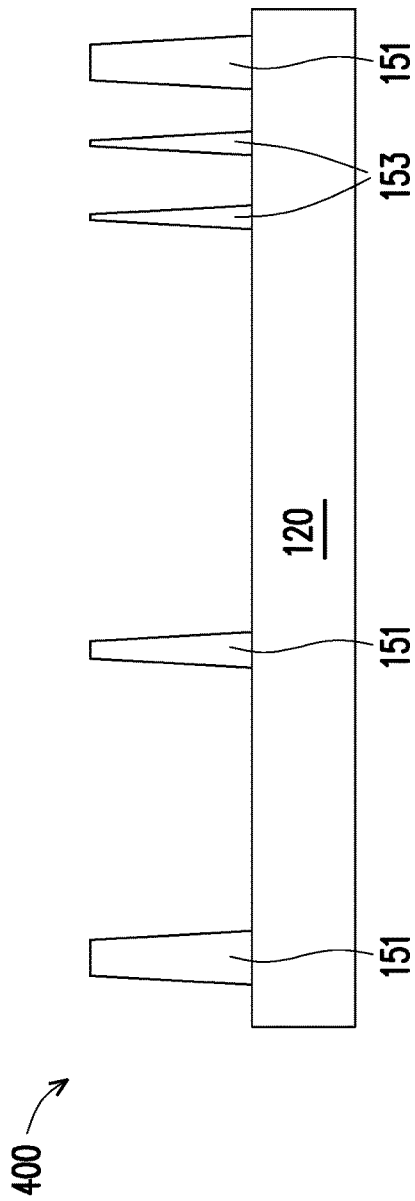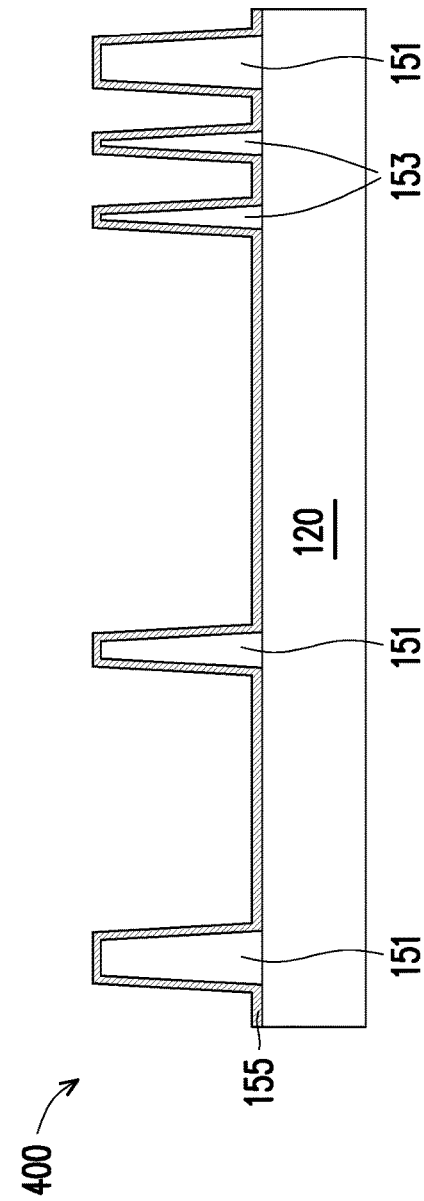

SEMICONDUCTOR DEVICE WITH SHIELD FOR ELECTROMAGNETIC INTERFERENCE

PRIORITY CLAIM AND CROSS-REFERENCE

This application claims priority to U.S. Provisional Patent Application No. 62/527,879, filed Jun. 30, 2017, entitled "Semiconductor Device with Shield for Electromagnetic Interference," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

An example of these packaging technologies is the Package-on-Package (POP) technology. In a PoP package, a top semiconductor packages is stacked on top of a bottom semiconductor package to allow high level of integration and component density. Another example is the Multi-Chip-Module (MCM) technology, where multiple semiconductor dies are packaged in one semiconductor package to provide semiconductor devices with integrated functionalities.

The high level of integration of advanced packaging technologies enables production of semiconductor devices with enhanced functionalities and small footprints, which is advantageous for small form factor devices such as mobile phones, tablets and digital music players. Another advantage is the shortened length of the conductive paths connecting the interoperating parts within the semiconductor package. This improves the electrical performance of the semiconductor device, since shorter routing of interconnections between circuits yields faster signal propagation and reduced noise and cross-talk.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-2 illustrate cross-sectional views of a semiconductor die at various stages of fabrication, in accordance with some embodiments.

FIGS. 5, 6, 7A, 7B, 7C, and 8 illustrate various views of a semiconductor device at various stages of fabrication, in accordance with some embodiments.

FIGS. 9-12 illustrate cross-sectional views of a semiconductor device at various stages of fabrication, in accordance with some embodiments.

FIGS. 13, 14, 15, 16, 17A, and 17B illustrate various views of a semiconductor device at various stages of fabrication, in accordance with some embodiments.

DETAILED DESCRIPTION

Figure 3:
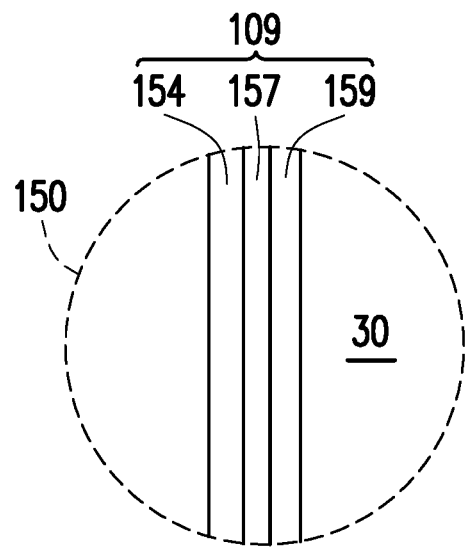
FIGS. 3 and 4 illustrate zoomed-in views of the semiconductor die illustrated in FIG. 2, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-2 illustrate cross-sectional views of a semiconductor die at various stages of fabrication, in accordance with some embodiments. In FIG. 1, a plurality of semiconductor dies 30 (see FIG. 2), which may also be referred to as integrated circuit dies or dies, are formed in a semiconductor wafer 30'. Tens, hundreds, or even more semiconductor dies 30 may be formed in the semiconductor wafer 30', and will be singulated (see FIG. 2) to form a plurality of individual semiconductor dies 30.

The wafer 30' may include or be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate and may be interconnected by interconnect structures formed by, for example, metallization patterns in one or more dielectric layers on the semiconductor substrate to form integrated circuits in the semiconductor dies 30.

The semiconductor dies 30 further comprise contact pads 101, such as aluminum pads, to which external connections are made. The contact pads 101 are on what may be referred to as respective active sides or front sides of the semiconductor dies 30. A passivation film 103 is on the semiconductor dies 30 and may be on portions of the contact pads 101. Openings are through the passivation film 103 to the contact pads 101. Die connectors 105, such as conductive pillars (for example, comprising a metal such as copper), may extend into the openings through the passivation film 103 and are mechanically and electrically coupled to the respective contact pads 101. The die connectors 105 may be formed by, for example, plating, or the like. The die connectors 105 electrically couple the respective integrated circuits of the semiconductor dies 30. In the description hereinafter, the die connectors 105 may also be referred to as conductive pillars 105.

A dielectric material 107 is on the active sides of the semiconductor dies 30, such as on the passivation film 103 and the die connectors 105. The dielectric material 107 laterally encapsulates the die connectors 105. The dielectric material 107 may be a polymer such as PBO, polyimide, BCB, or the like; a nitride such as silicon nitride or the like; an oxide such as silicon oxide, PSG, BSG, BPSG, or the like; or a combination thereof, and may be formed, for example, by spin coating, lamination, chemical vapor deposition (CVD), or the like. In the example of FIG. 1, a top surface of the dielectric material 107 extends further away from the contact pads 101 than top surfaces of the conductive pillars 105.

Next, in FIG. 2, the front side of the wafer 30' is attached to a tape 108, such as a dicing tape, and is singulated along lines 31 to form a plurality of dies 30. A conductive coating 109, which comprises a copper layer or other suitable material that is capable of providing electromagnetic shielding to reduce electromagnetic interference (EMI) or reduce electromagnetic susceptibility (EMS), is formed over the back side (e.g., the side opposing the front side) of the dies 30 and over the sidewalls of the dies 30. The conductive coating 109 may comprise one or more sublayers (see FIGS. 3 and 4), and at least one of the sublayers may comprise a suitable metal, such as copper. In some embodiments, the conductive coating 109 is conformally formed over the back sides and the sidewalls of the dies 30. Although not illustrated in FIG. 2, the conductive coating 109 may also be formed over the upper surface of the tape 108. The conductive coating 109 may also be referred to as metal coating 109 in the description hereinafter.

Figure 4:
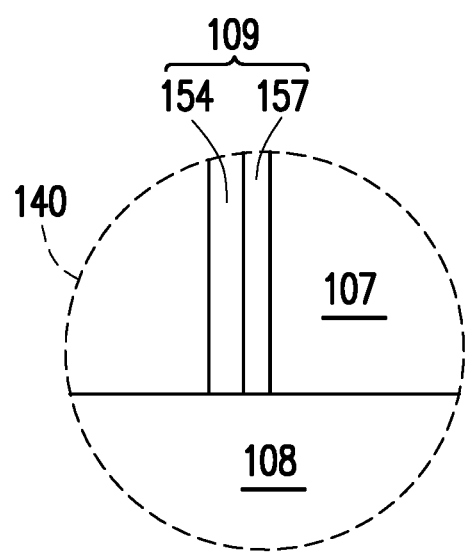

FIGS. 3 and 4 illustrate zoomed-in views of an area 150 and an area 140 of the semiconductor die 30 in FIG. 2, respectively, in some embodiments. The structures of the conductive coating 109 in FIGS. 3 and 4 are merely non-limiting examples, and other numbers of sublayers and/or other structures are also possible and are fully intended to be included within the scope of the present disclosure.

As illustrated in FIG. 3, the conductive coating 109 comprises three sublayers, such as an interface layer 159, a barrier layer 157, and a conductive layer 154. The interface layer 159 is formed on the backside and the sidewalls of the die 30, e.g., between the die 30 and the barrier layer 157. The interface layer 159 may comprise a suitable material such as silicon oxide, and may be formed by thermal oxidization, CVD, physical vapor deposition (PVD), combinations therefore, the like, or other suitable formation method. The interface layer 159 may act as an adhesion layer between the semiconductor die 30 and a subsequently formed layer (e.g., 157), and may help the subsequently formed layers (e.g., 157 and 109) to adhere to the semiconductor die 30.

As illustrated in FIG. 3, the barrier layer 157 is formed over the interface layer 159. The barrier layer 157 may be formed to prevent or reduce diffusion of the material (e.g., copper) of the metal coating 109 into, e.g., the substrate of the semiconductor dies 30. In some embodiments, the barrier layer 157 comprises titanium nitride, although other materials, such as tantalum nitride, titanium oxide, tantalum oxide, titanium, tantalum, or the like may alternatively be utilized. The barrier layer 157 may be formed using a CVD process, such as plasma-enhanced CVD (PECVD). However, other alternative processes, such as sputtering or metal organic chemical vapor deposition (MOCVD), atomic layer deposition (ALD), may alternatively be used.

Next, the conductive layer 154 is formed over the barrier layer 157. The conductive layer 154 may comprise a suitable metal such as copper, and may have a thickness between about 3 μm and about 5 μm, such as about 3 μm, although other dimensions are also possible. Suitable deposition methods, such as sputtering, spraying, or plating, may be used to form the conductive layer 154. In some embodiments, a seed layer (not shown) is formed over the barrier layer 157, then the conductive layer 154 is formed over the seed layer using a plating process.

In embodiments where the interface layer 159 (e.g., silicon oxide) is formed by thermal oxidization of the substrate (e.g., silicon) of the semiconductor die 30, the conductive coating 109 in the area 140 of the semiconductor die 30 may have a different structure than the conductive coating 109 in the area 150, as illustrated in FIG. 4. The conductive coating 109 in the area 140 corresponds to portions of the conductive coating 109 disposed along sidewalls of the dielectric material 107 of the die 30. Since the thermal oxidization process does not generate, e.g., silicon oxide, over the dielectric material 107, the interface layer 159 illustrated in FIG. 3 is not formed in the area 140. Therefore, the conductive coating 109 in the area 140 comprises the barrier layer 157 and the conductive layer 154, both of which are electrically conductive layers.

FIGS. 5, 6, 7A, 7B, 7C, and 8 illustrate various views of a semiconductor device 200 at various stages of fabrication, in accordance with some embodiments. In FIG. 5, the die 30 with the metal coating 109 as illustrated in FIG. 2 is attached to a carrier 120 by an adhesive layer 121, with the front side of the die 30 facing away from the carrier 120. A second die 40, which may be a die having different functionalities from the die 30, is also attached to the carrier 120 with the front side of the die 40 facing away from the carrier 120.

The carrier 120 may be made of a material such as silicon, polymer, polymer composite, metal foil, ceramic, glass, glass epoxy, beryllium oxide, tape, or other suitable material for structural support. The adhesive layer 121 is deposited or laminated over the carrier 120, in some embodiments. The adhesive layer 121 may be photosensitive and may be easily detached from the carrier 120 by shining, e.g., an ultra-violet (UV) light on the carrier 120 in a subsequent carrier de-bonding process. For example, the adhesive layer 121 may be a light-to-heat-conversion (LTHC) coating made by 3M Company of St. Paul, Minn.

The second die 40 may be formed in similar processing steps as those of the die 30 described above, but without the metal coating 109. The die 40 has contact pads 111 in a passivation film 113, conductive pillars 115 coupled to the contact pads 111, and a dielectric material 117 over the conductive pillars 115. The contact pads 111, the passivation film 113, the conductive pillars 115, and the dielectric material 117 of the die 40 may comprise a same or similar material as the contact pads 101, the passivation film 103, the conductive pillars 105, and the dielectric material 107 of the die 30, respectively, and may be formed using a same or similar method. Details are thus not repeated.

In some embodiments, the die 30 is an radio frequency (RF) die, and the die 40 is a digital logic die. Since an RF die (e.g., the die 30) may be more susceptible to electromagnetic interference than a logic die (e.g., the die 40), the die 30 has the metal coating 109 to shield the die 30 from EMI. The metal coating 109 may also contain (e.g., limit) the EM interference produced by the die 30, such that the EM interference produced by the die 30 causes little or no inference for other dies (e.g., the die 40). The die 40 is free of the metal coating 109 in the illustrated embodiment. In other embodiments, both the die 30 and the die 40 have the metal coating 109, and the die 40 is formed following similar processing steps as illustrated in FIGS. 1-4.

Next, a molding material 123 is formed over the carrier 120 and around the dies 30 and 40. The molding material 123, as deposited, may extend over the upper surfaces of the dies 30 and 40. The molding material 123 may comprise an epoxy, an organic polymer, a polymer with or without a silica-based or glass filler added, a polyamide, or other materials, as examples. In some embodiments, the molding material 123 comprises a liquid molding compound (LMC) that is a gel type liquid when applied. The molding material 123 may also comprise a liquid or solid when applied. The molding material 123 may be molded using, for example, compressive molding, transfer molding, or other methods.

Once deposited, the molding material 123 may be cured by a curing process. The curing process may comprise heating the molding material 123 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 123 may be cured using other methods. In some embodiments, a curing process is not performed.

Next, a planarization process, such as a chemical mechanical polish (CMP), may be performed to remove upper portions of the molding material 123, and to expose the conductive pillars 105 of the die 30 and to expose the conductive pillars 115 of the die 40. The planarization process achieves a substantially coplanar upper surface between the conductive pillars (e.g., 105, 115), the dielectric materials (e.g., 107, 117), and the molding material 123. The planarization process may remove upper portions of the dielectric materials 107/117 and may further remove top portions of the conductive pillars 105/115.

Next, in FIG. 6, a redistribution structure 130 is formed over the die 30, the die 40, and the molding material 123. The redistribution structure 130 comprises conductive features such as one or more layers of conductive lines 131 and vias 133 formed in one or more dielectric layers 132. In some embodiments, the one or more dielectric layers 132 are formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The one or more dielectric layers 132 may be formed by any acceptable deposition process, such as spin coating, chemical vapor deposition (CVD), laminating, the like, or a combination thereof.

In some embodiments, the conductive features of the redistribution structure 130 comprise conductive lines 131 and/or conductive via 133 formed of a suitable conductive material such as copper, titanium, tungsten, aluminum, or the like. The conductive features may be formed by, e.g., forming openings in the dielectric layer 132 to expose underlying conductive features, forming a seed layer over the dielectric layer 132 and in the openings, forming a patterned photoresist with a designed pattern over the seed layer, plating (e.g., electroplating or electroless plating) the conductive material in the designed pattern and over the seed layer, and removing the photoresist and portions of seed layer on which the conductive material is not formed.

The redistribution structure 130 is electrically coupled to the dies 30 and 40. Conductive pads 137, which may be under bump metallurgy (UBM) structures, may be formed over and electrically coupled to the redistribution structure 130. As illustrated in FIG. 6, at least one conductive line 131A of the redistribution structure 130 extends to and is exposed at a sidewall of the redistribution structure 130. The conductive line 131A may be used to connect to a subsequently formed conductive layer 119 (see FIG. 8) and to ground the conductive layer 119.

As illustrated in FIG. 6, the metal coating 109 of the die 30 is electrically coupled to the conductive line 131A through, e.g., a via 133A. The conductive line 131A is electrically coupled to a ground contact pad 101A (e.g., a contact pad configured to be connected to an electrical ground), such as the leftmost or the rightmost contact pad of the die 30 in FIG. 6, in some embodiments. The ground contact pad 101A is coupled to the electrical ground (not shown) through an external connector 143 (e.g., see 143A in FIG. 8) attached to a conductive pad 137A, in some embodiments. Therefore, the metal coating 109 of the die 30 is grounded to provide shielding from electromagnetic interference for the die 30. The metal coating 109 may also prevent or reduce the electromagnetic inference generated by the die 30 from interfering with other dies (e.g., the die 40) in the system.

Figure 7A:
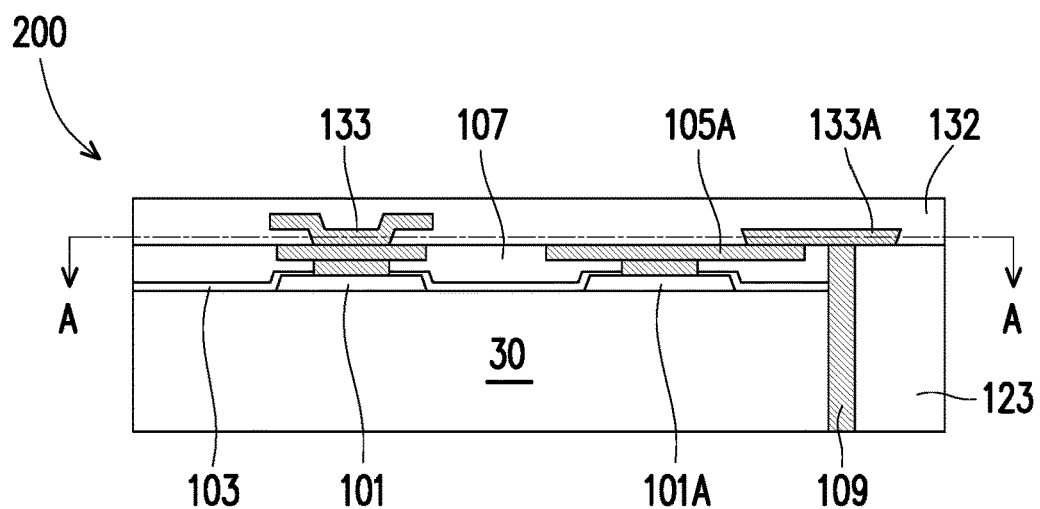

FIG. 7A is a cross-sectional view of a portion of the semiconductor device 200 showing details of the grounding of the metal coating 109 as illustrated in FIG. 6, in an embodiment. As illustrated in FIG. 7A, the ground contact pad 101A is coupled to a conductive pillar 105A, which conductive pillar 105A may be formed to have an extension portion that extends from the ground contact pad 101A to a location close to the edge (e.g., sidewalls) of the die 30, and therefore, close to the metal coating 109 in order to facilitate electrical connection with the metal coating 109. The via 133A, which may be formed in a first via layer (e.g., a via layer of the redistribution structure 130 closest to the die 30) of the redistribution structure 130, connects the conductive pillar 105A to the metal coating 109.

Figure 7B:
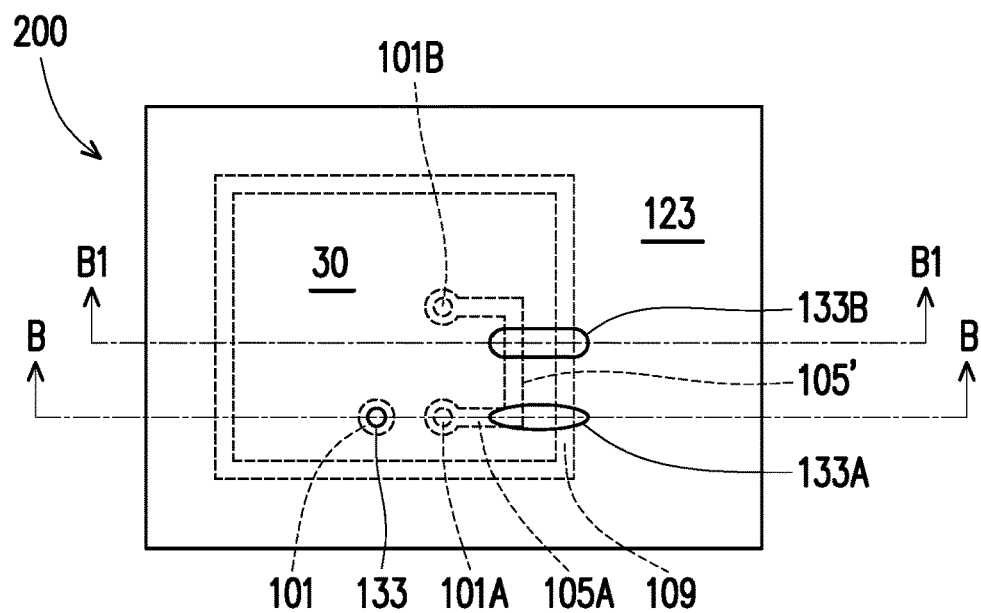

FIG. 7B is a cross-sectional view of the semiconductor device 200 in FIG. 7A along cross-section A-A. The cross-section A-A is across the via 133A, thus the conductive pillar 105A and the ground contact pad 101A are not visible in the plane of the cross-section A-A, and thus, are shown in phantom in FIG. 7B. For simplicity, not all layers and not all components of the semiconductor device 200 are shown in the top view of FIG. 7B. FIG. 7A is a cross-sectional view of portions of the semiconductor device 200 in FIG. 7B along the cross-section B-B.

As illustrated in FIG. 7B, the conductive coating 109 is around the sidewalls of the die 30. The contact pad 101 and the ground contact pad 101A shown in FIG. 7A are illustrated on a same line as the cross-section B-B in FIG. 7B. Also illustrated in FIG. 7B are the via 133 above the contact pad 101 in FIG. 7A, and the conductive pillar 105A coupled to the ground contact pad 101A in FIG. 7A. Furthermore, an additional ground contact pad 101B, which is formed in the dielectric material 107 and electrically connected to the ground contact pad 101A by a conductive feature 105' (e.g., a conductive line formed in the dielectric material 107), is shown in FIG. 7B. Since the contact pad 101B and the conductive feature 105' are not on the line of the cross-section B-B, they are not visible in the cross-sectional view of FIG. 7A.

In the illustrated embodiment of FIG. 7B, the via 133A is formed differently from the other vias (e.g., the vias 133) of the redistribution structure 130 to facilitate the electrical connection between the via 133A and the metal coating 109. In particular, the via 133A may have an elongated shape instead of, e.g., a circular shape, in a top view. The elongated shape of the via 133A has a larger dimension along the direction B-B than a dimension along a direction perpendicular to the direction B-B, in some embodiments. The elongated shape of the via 133A provides a large tolerance for inaccuracies of the photolithography process used to form the pattern for the via 133A. For example, the elongated shape makes it easier to achieve a reliable electrical connection between the via 133A and the metal coating 109, even if the actual location of the via 133A is shifted to the left or to the right by a little (e.g., by a few nanometers) compared with an intended location (e.g., designed location).

In FIG. 7B, the via 133A is shown to have an oval shape, although other elongated shapes, such as a rectangular shape, a race track shape (e.g., a rectangle with semi-circular shapes on opposing sides of the rectangle, see 133B), and other suitable shapes may also be used. A second via 133B, which is not visible in the cross-sectional view of FIG. 7A, connects the conductive feature 105' with the metal coating 109. The second via 133B is illustrated to have the race track shape as an example. In other embodiments, the second via 133B may have the same shape (e.g., oval shape) as the first via 133A, or may have other suitable shapes. Therefore, in the example of FIG. 7B, the metal coating 109 is grounded by the via 133A and the via 133B, thus further increasing the reliability of the grounding of the metal coating 109.

Figure 7C:
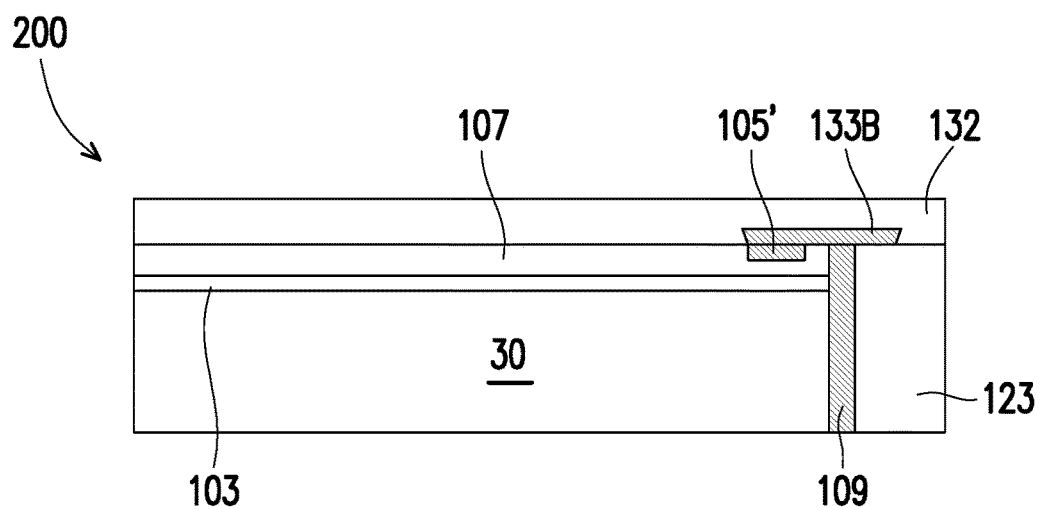

FIG. 7C illustrates the cross-sectional view of the semiconductor device 200 shown in FIGS. 7A and 7B, but along cross-section B1-B1 of FIG. 7B. As illustrated in FIG. 7C, the via 133B electrically connects the conductive feature 105' with the metal coating 109. Since the conductive feature 105' is coupled to the ground contact pads 101A and 101B (see FIG. 7B), the metal coating 109 is grounded.

Figure 8:
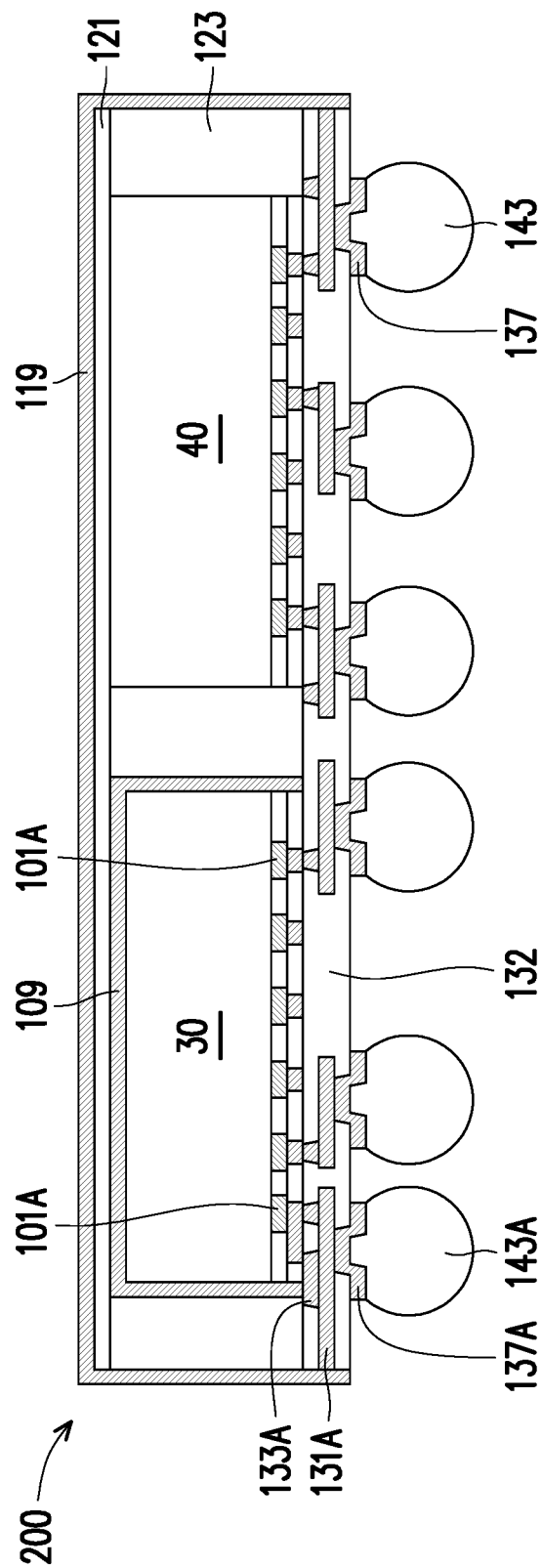

Next, in FIG. 8, external connectors 143 are formed over the conductive pads 137, the carrier 120 is de-bonded, and a conductive layer 119 is formed over sidewalls and an upper surface of the molding material 123. In some embodiments, the external connectors 143 are conductive bumps such as controlled collapse chip connection (C4) bumps or ball grid array (BGA) bumps, and may comprise a material such as tin, or other suitable materials, such as silver or copper. In an embodiment in which the external connectors 143 are tin solder bumps, the external connectors 143 may be formed by initially forming a layer of tin through any suitable method such as evaporation, electroplating, printing, solder transfer, or ball placement. Once a layer of tin has been formed on the conductive pads 137, a reflow is performed in order to shape the material into the desired bump shape.

However, as one of ordinary skill in the art will recognize, while the external connectors 143 have been described above as C4 bumps or BGA bumps, these are merely intended to be illustrative and are not intended to limit the embodiments. Rather, any suitable type of external contacts, such as microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the external connectors 143, and all such external connectors are fully intended to be included within the scope of the embodiments.

In some embodiments, the carrier 120 is de-bonded after the external connectors 143 are formed on the conductive pads 137. For example, the structure shown in FIG. 6, with the external connectors 143 formed, is flipped upside down, and the external connectors 143 are attached to a tape (e.g., a dicing tape, not shown). The tape is soft and has a thickness larger than the height of external connectors 143, in some embodiments. The semiconductor device 200 may therefore be pressed onto the tape such that the external connectors 143 are embedded in (e.g., pressed into) the tape. This may prevent electrical short of the semiconductor device 200 in a subsequent processing step to form the conductive layer 119.

Next, the carrier 120 is de-bonded by a suitable method such as chemical wet etching, plasma dry etching, mechanical peel-off, CMP, mechanical grinding, thermal bake, laser scanning, or wet stripping, as examples. In some embodiments, the carrier 120 is a glass carrier and is de-bonded by a shining a light on the carrier 120. For example, ultraviolet (UV) light emitted by an excimer laser may go through the glass carrier and is absorbed near the glass/adhesive interface. The ultraviolet light initiates a photochemical process that breaks the chemical bonds in the adhesive layer 121. As a result, the glass carrier 120 is easily removed.

In other embodiments, the carrier de-bonding may be performed before the external connectors 143 are formed, e.g., by attaching the redistribution structure 130 to a tape and then removing the carrier 120. After the carrier 120 is de-bonded, the semiconductor device 200 is removed from the tape and is flipped upside down, and the external connectors 143 are formed over the conductive pads 137. These and other variations of the processing steps are fully intended to be included within the scope of the present disclosure. In embodiments where multiple semiconductor devices 200 are formed at the same time, a singulation process (not shown) is performed to form a plurality of individual semiconductor devices 200.

Next, the conductive layer 119, which may comprise copper or other suitable material for electromagnetic interference protection, is formed over the semiconductor device 200 using, e.g., plating, sputtering, spraying, or other suitable formation method. A thickness of the conductive layer 119 may range from about 3 μm to about 5 μm, such as 3 μm, although other dimensions are also possible.

As illustrated in FIG. 8, the conductive layer 119 is formed on the backside of the dies 30/40 (e.g., over the adhesive layer 121) and along the sidewalls of the molding material 123. Since the conductive layer 119 (may also be referred to as a metal coating 119) does not contact the substrate of the dies 30 and 40, diffusion (e.g., copper diffusion) of the material of the conductive layer 119 may not be a concern, and therefore, a barrier layer similar to the barrier layer 157 (see FIG. 3) may be omitted in the formation of the conductive layer 119. Therefore, unlike the conductive coating 109 (see FIG. 3), which has an underlying barrier layer 157 and an underlying interface layer 159, the conductive layer 119 may be formed over the sidewalls of the molding material 123 and over the adhesive layer 121 without a barrier layer between the conductive layer 119 and the dies 30/40, in some embodiments. In some embodiments, the conductive layer 119 has a single-layer structure and is formed of a suitable material such as copper, in which case the conductive layer 119 (e.g., copper) directly contacts, e.g., the molding material 123, the adhesive layer 121, and the one or more dielectric layers 132. In some embodiments, depending on, e.g., the material of the conductive layer 119, there might be an interface layer between the conductive layer 119 and, e.g., the molding material 123, the adhesive layer 121, and the one or more dielectric layers 132.

As illustrated in FIG. 8, the conductive layer 119 is grounded by coupling to the conductive line 131A, which is exposed at the sidewall of the redistribution structure 130, in some embodiments. FIG. 8 also illustrates a via 133A of the redistribution structure 130, which via 133A is coupled to the conductive coating 109 over the die 30 (similar to FIGS. 7A and 7B). Therefore, the conductive layer 119 and the conductive coating 109 are electrically grounded by coupling to one or more ground contact pads 101A, which are grounded by, e.g., one or more external connectors 143A connected to an electrical ground.

FIGS. 9-12 illustrate cross-sectional views of a semiconductor device 300 at various stages of fabrication, in accordance with some embodiments. Similar numerals in FIGS. 9-12 represent similar parts as in FIGS. 3-8, thus details are not repeated. As illustrated in FIG. 9, the semiconductor dies 30 and 40 are each attached to the carrier 120 via an adhesive layer 121. Note that in the example of FIG. 9, the dies 30 and 40 are not coated with the conductive coating 109 prior to being attached to the carrier 120. The dies 30 and 40 may be of the same type (e.g., having a same functionality) or of different types (e.g., having different functionalities). After the dies 30 and 40 are attached to the carrier 120, the conductive coating 109 is conformally formed over the die 30, the die 40, and the carrier 120.

In FIG. 9, portions of the conductive coating 109 in regions 150', e.g., the portions of the conductive coating 109 contacting the semiconductor substrate of the dies 30 and 40, may have a same structure as illustrated in FIG. 3. In addition, other portions of the conductive coating 109, e.g., the portions of the conductive coating 109 over the dielectric material 107, over the adhesive layer 121 and over the carrier 120 may have a same structure as illustrated in FIG. 4.

Next, as illustrated in FIG. 10, the molding material 123 is formed over the carrier 120 and around the dies 30/40. A curing process may be performed to cure the molding material 123. Next, the (cured) molding material 123 is planarized, e.g., by a CMP process, to expose the conductive pillars 105 of the die 30 and the conductive pillars 115 of the die 40. The planarization process removes portions of the conductive coating 109 over the front sides of the dies 30 and 40. Therefore, in the cross-sectional view of FIG. 10, after the planarization, the remaining portions of the conductive coating 109 have a U-shape between the dies 30 and 40, and have an L-shape proximate the exterior sidewalls (e.g., sidewalls proximate edges of the semiconductor device 300) of the dies 30 and 40.

Figure 11:
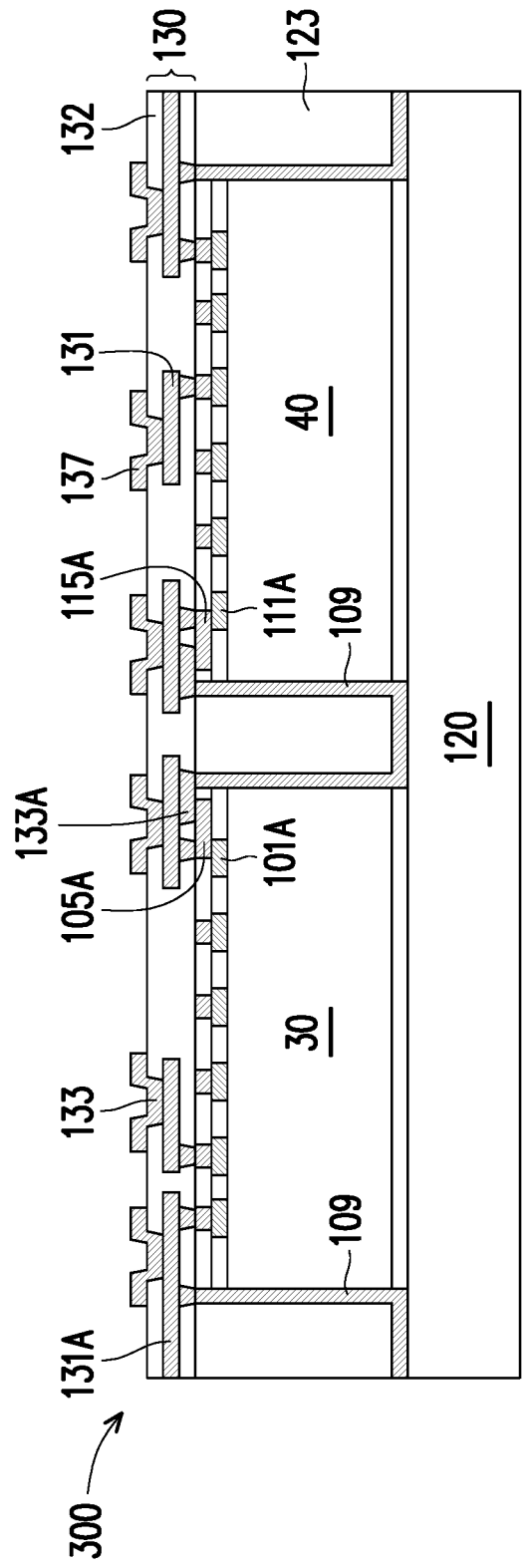

Next, in FIG. 11, the redistribution structure 130 is formed over the front sides of the dies 30 and 40, and are electrically coupled to the dies 30 and 40. The redistribution structure 130 comprises conductive lines 131 and vias 133. Conductive pads 137, which may be UBM structures, are formed over the upper surface of the redistribution structure 130. At least one conductive line 131A of the redistribution structure 130 is exposed at the sidewall of the redistribution structure 130.

In the illustrated example of FIG. 11, the conductive coating 109 is grounded through connection to the redistribution structure 130 (e.g., through the vias 133A) and to the ground contact pad 101A, similar to the embodiments illustrated in FIGS. 7A and 7B. The conductive coating 109 may also be electrically coupled to a ground contact pad 111A of the die 40 through the redistribution structure 130, as illustrated in FIG. 11.

Figure 12:
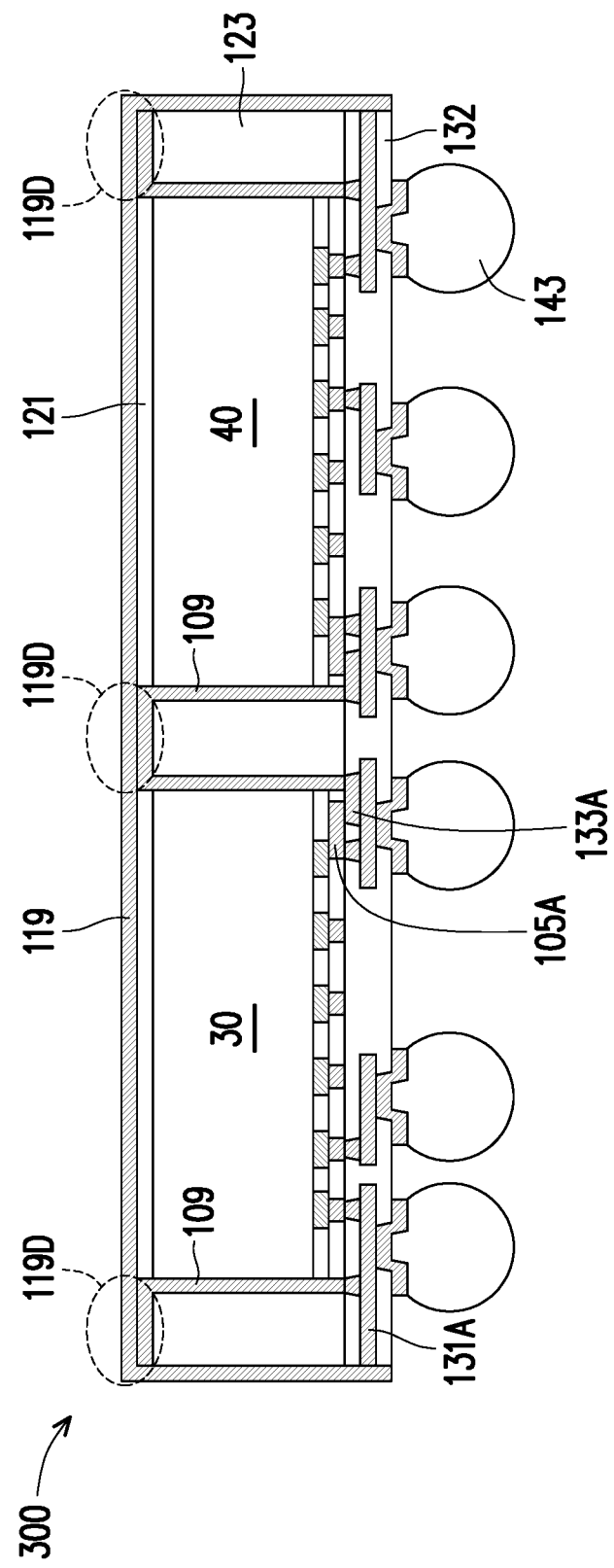

Next, as illustrated in FIG. 12, the external connectors 143 are formed over the conductive pads 137, the carrier 120 is de-bonded, and the conductive layer 119 is formed over the backsides of the dies 30/40 (e.g., over the adhesive layer 121) and over the sidewalls of the molding material 123. The conductive layer 119 is grounded by coupling to the conductive line 131A exposed by the sidewall of the redistribution structure 130, in some embodiments.

In some embodiments, the conductive layer 119 is conformally formed, and may have a thickness equal to the thickness of the conductive coating 109, which is also conformally formed. Note that in regions 119D, the conductive layer 119 and the conductive coating 109 merge to form a conductive layer (e.g., copper) that is thicker (e.g., about twice as thick) than the conductive layer 119 or the conductive coating 109 in regions other than the regions 119D. For example, a thickness of the (merged) conductive layer between the dies 30 and 40 may be twice of a thickness of the conductive coating 109 along the sidewalls of the dies 30 and 40. As another example, a thickness of the (merged) conductive layer between the dies 30 and 40 may be twice of a thickness of the conductive layer 119 along the sidewalls of the molding material 123 or over the adhesive layer 121. In the cross-sectional view of FIG. 12, the conductive layer 119 and the conductive coating 109 form U-shapes between the dies 30 and 40 and proximate exterior sidewalls of the dies 30 and 40. In other embodiments, the conductive layer 119 and the conductive coating 109 have different thicknesses.

FIGS. 13, 14, 15, 16, 17A, and 17B illustrate various views of a semiconductor device 400 at various stages of fabrication, in accordance with some embodiments. In FIG. 13, a dielectric film, such as a photo sensitive dielectric layer, is formed over the carrier 120. The dielectric film is patterned using, photolithography and/or etching process to form structures 151 and 153. In some embodiments, due to the photolithography process used, a width of the structures 151 (or 153) in the cross-sectional view of FIG. 13 decreases as the structures 151 (or 153) extend away from the carrier 120. For example, the structures 151 and 153 have trapezoidal cross-sections, as illustrated in FIG. 13. More details of the structures 151/153 are described hereinafter.

In FIG. 14, a conductive layer 155, such as copper or other suitable material capable of providing EMI shielding and/or protection, is formed over the structure shown in FIG. 13. The conductive layer 155 may comprise a metal (e.g., copper), and may be formed by sputtering, spraying, plating, or other suitable method. A thickness of the conductive layer 155 is between about 3 μm and about 5 μm, in some embodiments, although other dimensions are also possible.

In some embodiments, the structures 151 are dielectric structures. Referring temporarily to FIG. 17B, which is a cross-sectional view of the semiconductor device 400 along cross-section E-E in FIG. 17A, the structures 151 may comprise dielectric structures that surround the die 30 and/or the die 40. The structures 151 may be a continuous dielectric structure that encircles the die 30 and/or the die 40, as shown in FIG. 17B, in some embodiments. In other embodiments, the structures 151 may comprise multiple discrete segments (e.g., segments that have gaps in between, not shown) of dielectric structures that encircle the die 30 and/or the die 40. Although the structures 151 are made of a dielectric material, after being coated by the conductive layer 155, the coated structures 151 form an electromagnetically shielding structure around the semiconductor dies 30/40 to prevent or reduce EMI (see FIGS. 17A and 17B).

Referring back to FIG. 14, in some embodiments, the structures 153 are dielectric structures and have a substantially cylindrical shape or a truncated cone shape. After being coated with the conductive layer 155, each coated structure 153 forms a conductive via, in some embodiments. Referring temporarily to FIG. 17B, the coated structure 153 includes a solid dielectric core (e.g., the structure 153) with the conductive layer 155 coated on the exterior sidewalls of the dielectric core, in accordance with some embodiments.

Figure 15:
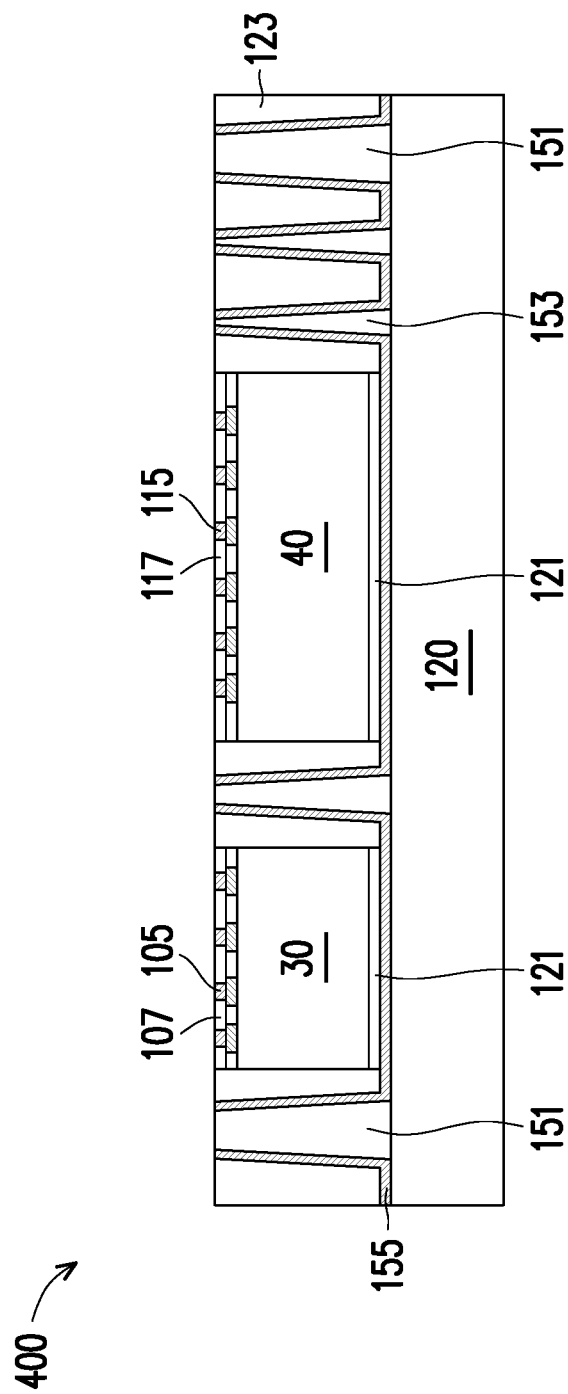

Referring now to FIG. 15, the semiconductor dies 30 and 40 are attached to the carrier 120 by the adhesive layer 121. Next, the molding material 123 is deposited, cured if needed, and then planarized to expose the conductive pillars 105/115 of the dies 30/40. The planarization process also removes the top portions of the conductive layer 155 (e.g., portions of the conductive layer 155 over upper surfaces of the structures 151/153 distal the carrier 120) and exposes the dielectric material of the structures 151 and 153, as illustrated in FIG. 15.

Figure 16:
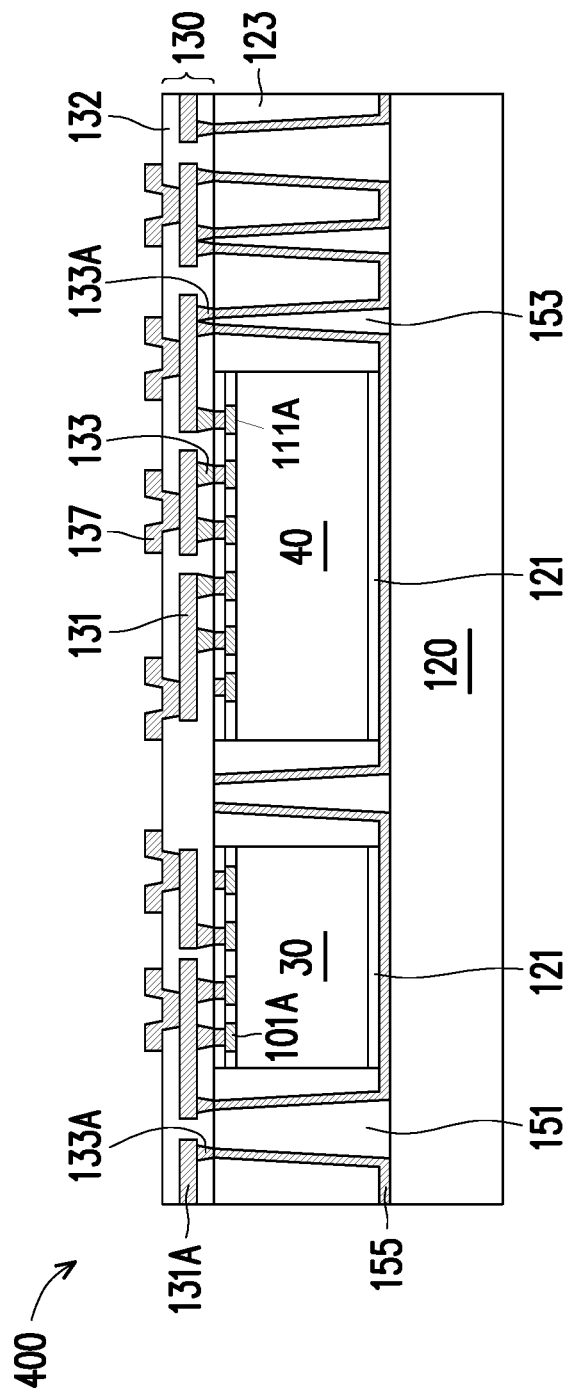

Next, in FIG. 16, the redistribution structure 130 is formed over the front sides of the dies 30 and 40. The redistribution structure 130 may comprise conductive lines 131 and vias 133. Conductive pads 137 are formed over and electrically coupled to the redistribution structure 130. A illustrated in FIG. 16, the conductive layer 155 is grounded by electrical connection to the redistribution structure 130 through, e.g., the vias 133A, which redistribution structure 130 comprises conductive lines and/or vias that are coupled to the ground contact pads 101A/110A, which in turn are coupled to one or more external connectors 143 (see FIG. 17B) that are electrically grounded. In some embodiments, a conductive line 131A of the redistribution structure 130 is exposed at the sidewall of the redistribution structure 130.

Figure 17A:
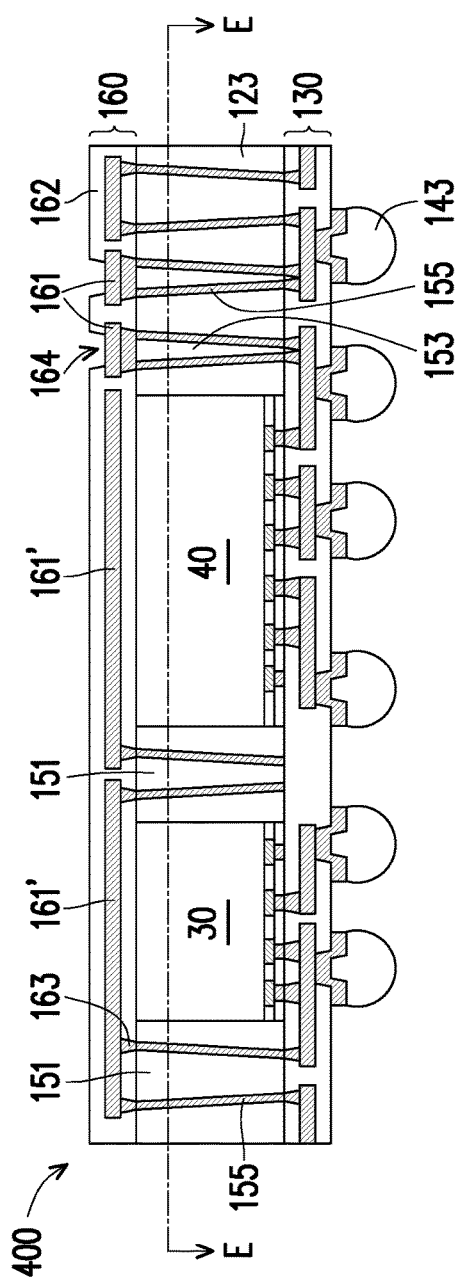
Figure 17B:
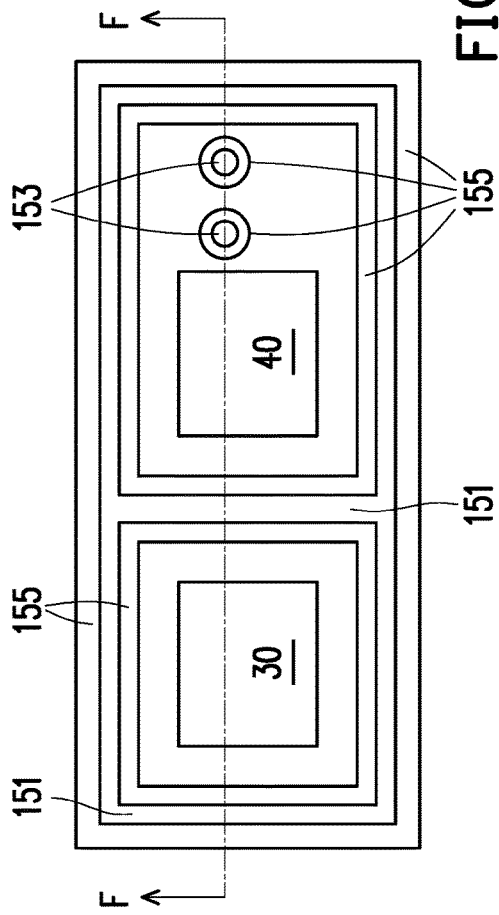

Next, in FIG. 17A, the external connectors 143 are formed, the carrier 120 is de-bonded, and the exposed surface (e.g., the surface proximate the back side of the dies 30/40) of the semiconductor device 400 after the carrier de-bonding is recessed by a suitable grinding process and/or an etching process, such as CMP. In some embodiments, the recessing process removes portions of the conductive layer 155 over the back sides of the dies 30 and 40. The recessing process may also remove the adhesive layer 121. Therefore, after the recessing process, the dielectric material of the structures 151/153 proximate the back sides of the dies 30 and 40 is exposed, in some embodiments.

Next, another redistribution structure 160 is formed over the back side of the dies 30 and 40, and may be formed using the same or similar formation methods as the redistribution structure 130. The redistribution structure 160 includes conductive lines 161 and vias 163 that are electrically coupled to the remaining portions of the conductive layer 155, such as portions of the conductive layers 155 over the sidewalls of the structure 151 and over the sidewalls of the structure 153. In some embodiments, conductive lines 161' of the redistribution structure 160 comprise ground planes. The ground planes (e.g., 161') and the structures 151 with conductive coating 155 form an EMI shield around and over the dies 30 and 40. The EMI shield reduces the EM interference for the dies 30 and 40. The EM shield may also contain, and thus, reduce the EM inference generated by the dies 30 and 40.

As illustrated in FIG. 17A, openings 164 are formed in the redistribution structure 160. The openings 164 may be formed by laser drilling, etching, or other suitable method. The openings 164 exposes portions of the conductive lines 161, which are electrically coupled to the conductive layer 155 over the structures 153 to electrically couple the redistribution structure 130 with the redistribution structure 160, in some embodiments. The exposed portion of the conductive lines 161 also provides access for electrical connection at the back sides of the dies 30 and 40. For example, another semiconductor device (not shown) may be placed above the semiconductor device 400, and be electrically and mechanically coupled to the exposed portions of the conductive lines 161 to form a PoP package.

FIG. 17B is a cross-sectional view of the semiconductor device 400 of FIG. 17A along cross-section E-E, and FIG. 17A is the cross-sectional view of the semiconductor device 400 in FIG. 17B along cross-section F-F. The molding material 123 is not shown in FIG. 17B for clarity. As illustrated in FIG. 17B, the structures 151 comprise a continuous structure around the dies 30 and 40, and the conductive layer 155 is formed on opposing sidewalls of the structures 151. FIG. 17B also illustrates the structures 153, which may have circular cross-sections, and the conductive layer 155 that are formed over the sidewalls of the structures 153.

FIG. 17B is merely a non-limiting example of the structures 151 and the structure 153, and other shapes and/or cross-sections for the structure 151 and the structure 153 are also possible and are fully intended to be included within the scope of the present disclosure. For example, the structure 151 may include multiple discrete (e.g., separate) segments of dielectric regions that collectively surround the dies 30 and 40. As another example, the cross-section of the structure 153 may have other suitable shapes such as an oval shape, a square shape or a rectangular shape.

Figure 18:
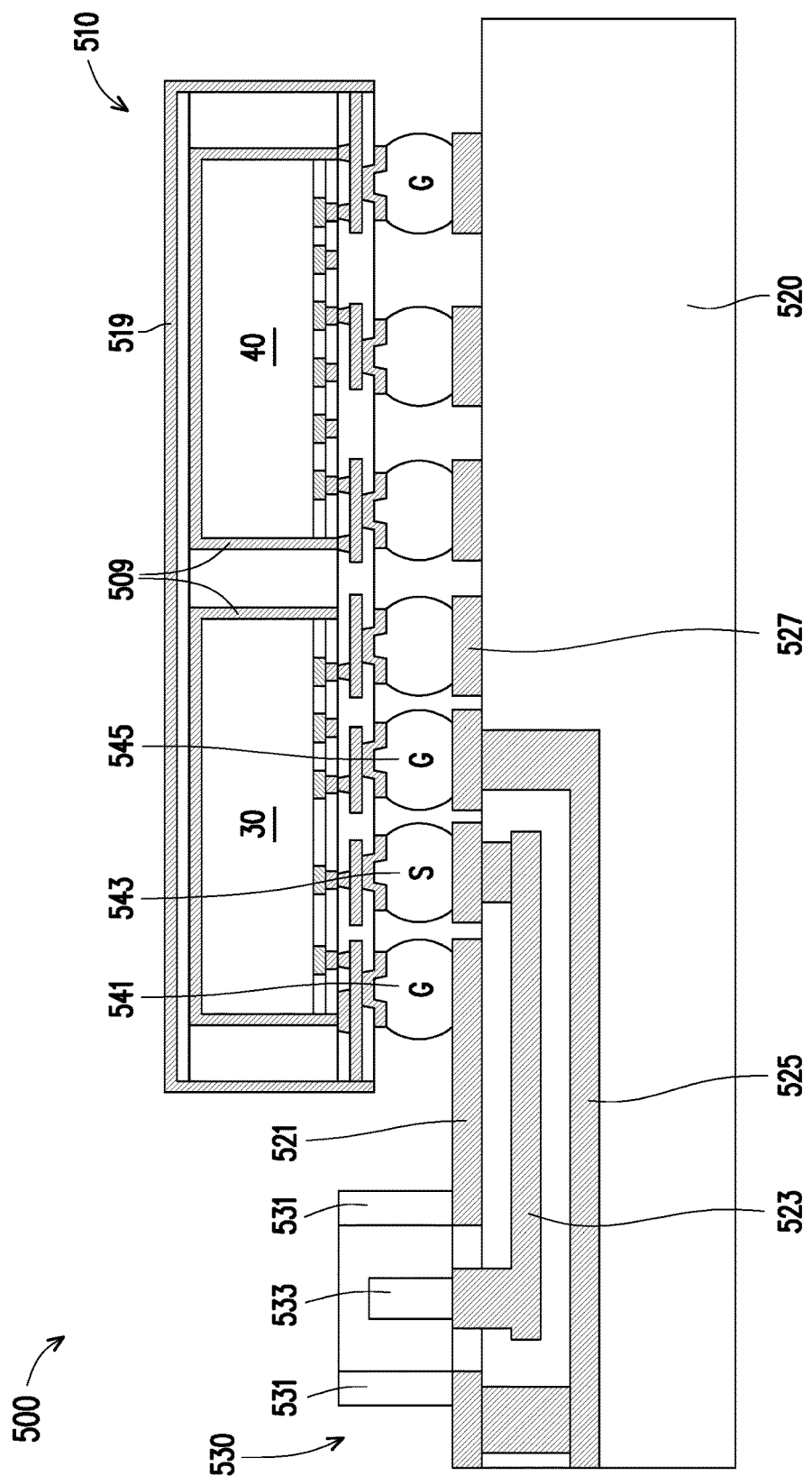
FIG. 18 illustrates a cross-sectional view of an electrical system with electromagnetic shield, in some embodiments.

FIG. 18 shows an electrical system 500 with EMI protection. The electrical system 500 comprises a semiconductor device 510, which is similar to the semiconductor device 200 in FIG. 8, but with metal coatings 509 for both the die 30 and the die 40. The metal coating 509 may be similar to the metal coating 109 in FIG. 8. The semiconductor device 510 further has a conductive layer 519, which may be similar to the conductive layer 119 of FIG. 8. The electrical system 500 further comprises a substrate 520, which may be a printed circuit board (PCB) with conductive traces (e.g., 521/523/525) and conductive pads (e.g., 527) formed therein and/or thereon. FIG. 18 further illustrates a connector 530 (e.g., an RF connector) that is mechanically and electrically coupled to the substrate 520. As illustrated in FIG. 18, the connector 530 has a signal terminal 533 and a ground terminal 531. The signal terminal 533 may be a terminal for carrying an RF signal (e.g., an RF input signal to be processed by the electrical system 500), the ground terminal 531 may be electrically grounded. In some embodiment, the ground terminal 531 is a metal shell or a metal mesh around the signal terminal 533 to provide good EMI protection.

As illustrated in FIG. 18, two external connectors 541 and 545 of the semiconductor device 510 are electrically grounded, and are connected to conductive lines 521 and 525 of the substrate 520, respectively, which conductive lines 521 and 525 are coupled to the ground terminal 531 of the connector 530. The signal terminal 533 of the connector 530 is connected to an external connector 543 of the semiconductor device 510, which external connector 543 is for connection with a signal (e.g., an RF input signal from the connector 530). In some embodiments, the conductive lines 521 and 525 are ground planes, and the conductive line 523 carrying the RF signal is disposed between the ground planes 521 and 525. The system 500 has excellent EMI protection. For example, there is double EMI shielding (e.g., conductive coatings 509 and 519) for the semiconductor device 510. In addition, the ground planes 521 and 525 disposed above and below the conductive line 523 provide enhanced EMI insulation for the conductive line 523 carrying an RF signal. These features, coupled with the EMI shielding for the signal terminal 533 offered by the ground terminal 531, provide good EMI protection throughout the signal chain of the electrical system 500, thus offering excellent robustness against EM interference.

Variations to the disclosed embodiments are possible and fully intended to be included within the scope of the present disclosure. For example, two semiconductor dies (e.g., 30 and 40) are used in the semiconductor device as examples. However, more or less than two dies may be used in the semiconductor device formed. As another example, the shape of the structure 151 (see FIG. 17B) may include two separate rings, with each of the rings surrounding one of the dies 30/40. In addition, each of the two separate rings may be a continuous ring, or a ring formed by multiple discrete segments. As yet another example, the number and the location of the structures 153 may be changed from those illustrated in FIG. 17B without departing from the spirit of the present disclosure.

Figure 19:
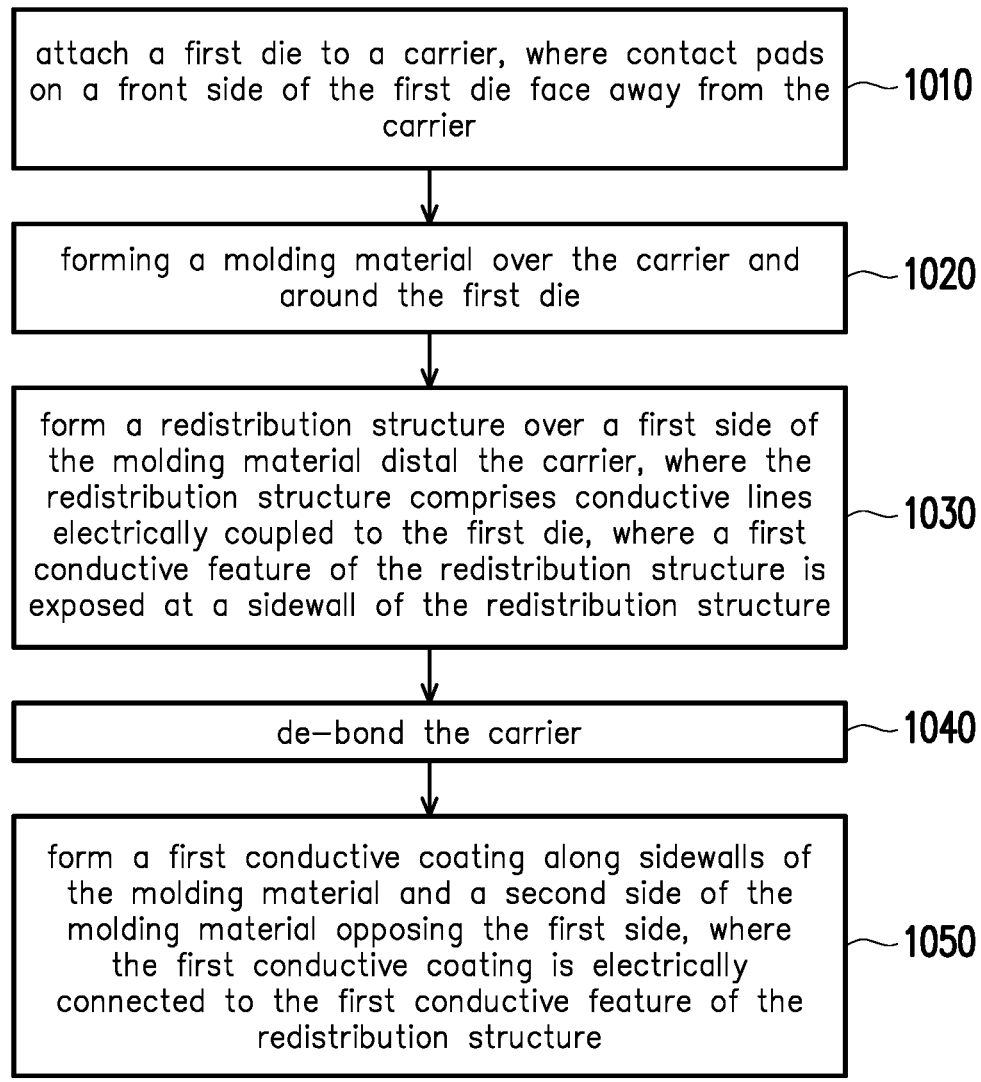
FIG. 19 illustrates a flow chart of a method for forming a semiconductor device, in some embodiments.

FIG. 19 illustrates a flow chart of a method for forming a semiconductor device, in accordance with some embodiments. It should be understood that the embodiment methods shown in FIG. 19 is an example of many possible embodiment methods. One of ordinary skill in the art would recognize many variations, alternatives, and modifications. For example, various steps as illustrated in FIG. 19 may be added, removed, replaced, rearranged and repeated.

Referring to FIG. 19, at step 1010, a first die is attached to a carrier, where contact pads on a front side of the first die face away from the carrier. At step 1020, a molding material is formed over the carrier and around the first die. At step 1030, a redistribution structure is formed over a first side of the molding material distal the carrier, where the redistribution structure comprises conductive lines electrically coupled to the first die, where a first conductive feature of the redistribution structure is exposed at a sidewall of the redistribution structure. At step 1040, the carrier is de-bonded. At step 1050, a first conductive coating is formed along sidewalls of the molding material and a second side of the molding material opposing the first side, where the first conductive coating is electrically connected to the first conductive feature of the redistribution structure.

Disclosed embodiments have many advantages. The metal coating 109 over the semiconductor dies 30/40 and/or the metal coating 119 over the exterior surface of the molding material 123 provide EMI protection, and therefore, the semiconductor device formed has better performance against EM interference. The disclosed EMI protection structures can be easily integrated with existing manufacturing flow, with little or no extra spaced needed to accommodate the EMI protection structures, thus allowing for low cost packages with small sizes and enhanced EMI protection. Features such as the elongated via 133A (see FIG. 7B) for connection to the metal coating (e.g., 109) allows for larger error margin for the photolithography process, and provide more reliable grounding of the metal coating. The disclosed EMI protection/insulation structure also simplifies the analysis of the EM performance of the semiconductor devices formed, and as a result, simulation time for analyzing the EM performance of the semiconductor devices is greatly reduced, which in turn reduces the design cycle and reduces the product to market time. Analysis shows that a near perfect Faraday cage may be achieved by connecting the metal coating (e.g., 109) with electrical ground at the first via layer (e.g., via 133A) of the redistribution structure. The double metal coating structure (e.g., 109 and 119) achieves improved EM performance by using the outer metal coating (e.g., 119) to further reducing the EM interference reaching the semiconductor device.

In an embodiment, a semiconductor device includes a first die embedded in a molding material, where contact pads of the first die are proximate a first side of the molding material; a redistribution structure over the first side of the molding material; a first metal coating along sidewalls of the first die and between the first die and the molding material; and a second metal coating along sidewalls of the molding material and on a second side of the molding material opposing the first side. In an embodiment, the first metal coating and the second metal coating are electrically connected to a ground contact. In an embodiment, the redistribution structure includes a via that is electrically coupled to the first metal coating. In an embodiment, the via has a first dimension along a first direction and a second dimension along a second direction perpendicular to the first direction, the second dimension being smaller than the first dimension. In an embodiment, the first die has a plurality of conductive pillars coupled to respectively ones of the contact pads, where at least one of the plurality of conductive pillars is electrically coupled to the first metal coating. In an embodiment, an upper surface of the plurality of the conductive pillars distal the contact pads is level with the first side of the molding material. In an embodiment, the second metal coating is electrically coupled to a conductive line of the redistribution structure, where the conductive line is exposed at a sidewall of the redistribution structure. In an embodiment, the semiconductor device further includes a second die embedded in the molding material and laterally spaced from the first die, where contact pads of the second die are electrically coupled to the redistribution structure. In an embodiment, sidewalls of the second die are free of a metal coating. In an embodiment, the first die and the second die have different functionalities. In an embodiment, the first metal coating extends continuously from the sidewalls of the first die to sidewalls of the second die.

In an embodiment, a semiconductor device includes a first die in a molding layer; a first redistribution structure on a first side of the molding layer and including conductive lines electrically coupled to contact pads of the first die; a second redistribution structure on a second side of the molding layer opposing the first side; a first conductive structure in the molding layer and laterally spaced from the first die, where the first conductive structure includes a first dielectric region around the first die; and conductive coatings on opposing sides of the first dielectric region; and a via in the molding layer, where the via is coupled to a first conductive line of the first redistribution structure and a second conductive line of the second redistribution structure. In an embodiment, the via includes a second dielectric region; and a second conductive coating on sidewalls of the second dielectric region. In an embodiment, the via is between the first die and the first conductive structure. In an embodiment, the first conductive structure is electrically coupled to at least one conductive line of the first redistribution structure and at least one conductive line of the second redistribution structure. In an embodiment, the second redistribution structure includes a ground plane, and the first conductive structure is electrically coupled to the ground plane.

In an embodiment, a method includes attaching a first die to a carrier, where contact pads on a front side of the first die face away from the carrier; forming a molding material over the carrier and around the first die; forming a redistribution structure over a first side of the molding material distal the carrier, where the redistribution structure includes conductive lines electrically coupled to the first die, where a first conductive feature of the redistribution structure is exposed at a sidewall of the redistribution structure; de-bonding the carrier; and forming a first conductive coating along sidewalls of the molding material and a second side of the molding material opposing the first side, where the first conductive coating is electrically connected to the first conductive feature of the redistribution structure. In an embodiment, the method further includes forming a second conductive coating over sidewalls and a back side of the first die before attaching the first die to the carrier. In an embodiment, the first die has conductive pillars over and electrically coupled to the contact pads of the first die, where a first one of the conductive pillars extends to an edge of the first die, where the first one of the conductive pillars is electrically coupled to the second conductive coating through a via of the distribution structure. In an embodiment, a via of the redistribution structure is electrically coupled to the second conductive coating. In an embodiment, the via is formed to have an oval shape in a top view.

In an embodiment, a method includes forming a first dielectric structure on a carrier; forming a conductive layer over the first dielectric structure; attaching a first die to the carrier, where the first die is laterally separated from the first dielectric structure; encapsulating the first die and the first dielectric structure in a molding layer; forming a first redistribution structure on a first side of the molding layer, the first redistribution structure comprising conductive lines electrically coupled to contact pads of the first die and coupled to the conductive layer over the first dielectric structure; de-bonding the carrier; and forming a second redistribution structure on a second side of the molding layer opposing the first side, the second redistribution structure comprising conductive lines electrically coupled to the conductive layer over the first dielectric structure. In an embodiment, the method further includes, after encapsulating the first die and the first dielectric structure and before forming the first redistribution structure, recessing the molding layer from the first side of the molding layer, where the recessing exposes conductive pillars of the first die and a first surface of the first dielectric structure. In an embodiment, the method further includes after de-bonding the carrier, recessing the molding layer from the second side of the molding layer, where the recessing exposes a second surface of the first dielectric structure opposing the first surface of the first dielectric structure. In an embodiment, the method further includes forming a second dielectric structure on the carrier, where the second dielectric structure is made of a same dielectric material as the first dielectric structure, where the conductive layer is formed over the second dielectric structure, and where the conductive layer over the second dielectric structure is electrically coupled between the conductive lines of the first redistribution structure and the conductive lines of the second redistribution structure.

In an embodiment, a semiconductor device includes a first die; a second die laterally spaced from the first die; a molding material, where the first die and the second die are surrounded by the molding material; a redistribution structure over a first side of the molding material, where a conductive line of the redistribution structure is exposed at a sidewall of the redistribution structure; and a first conductive layer on sidewalls of the molding material and on a second side of the molding material opposing the first side, where the first conductive layer is electrically connected to the conductive line of the redistribution structure. In an embodiment, the semiconductor device further includes a second conductive layer along sidewalls of the first die. In an embodiment, sidewalls of the second die are free of the second conductive layer.

In an embodiment, a package includes a substrate; a connector electrically coupled to first conductive pads of the substrate, the connector including a signal terminal and a ground terminal; and a semiconductor device electrically coupled to second conductive pads of the substrate, where the semiconductor device includes a first die embedded in a molding material, the first die having a first conductive coating on sidewalls of the first die; a redistribution structure over a first side of the molding material, the redistribution structure having conducive lines electrically coupled to the first die; a second conductive coating along sidewalls of the molding material and a second side of the molding material opposing the first side; and external connectors attached to the redistribution structure, where the external connectors includes a signal connector, a first ground connector, and a second ground connector, where the signal connector is coupled to the signal terminal by a conductive line of the substrate, where the first ground connector and the second ground connector are coupled to the ground terminal by a first ground plane and a second ground plane of the substrate, respectively, where the conductive line is between the first ground plane and the second ground plane. In an embodiment, the connector is a radio frequency (RF) connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device comprising:
   a first die embedded in a molding material, wherein contact pads of the first die are proximate a first side of the molding material, wherein the first die has a plurality of conductive pillars, each of the plurality of conductive pillars electrically coupled to a respective one of the contact pads;
   a redistribution structure over the first side of the molding material, wherein a via of the redistribution structure has a first dimension along a first direction and a second dimension along a second direction perpendicular to the first direction, the second dimension being smaller than the first dimension, wherein the first direction and the second direction are in a plane parallel to the first side of the molding material;
   a first metal coating along and in physical contact with sidewalls of the first die, the first metal coating disposed between the first die and the molding material, wherein a first conductive pillar of the plurality of conductive pillars is electrically coupled to the first metal coating, wherein the via of the redistribution structure has a first surface closest to the first die, and the first surface of the via physically contacts the first conductive pillar and the first metal coating; and a second metal coating along sidewalls of the molding material and along a second side of the molding material opposing the first side.

2. The semiconductor device of claim 1, wherein the first metal coating and the second metal coating are electrically connected to a ground contact.

3. The semiconductor device of claim 1, wherein an upper surface of the plurality of the conductive pillars distal the contact pads is level with the first side of the molding material and is level with a first surface of the first metal coating, the first surface of the first metal coating contacting the redistribution structure.

4. The semiconductor device of claim 1, wherein the second metal coating is electrically coupled to a conductive line of the redistribution structure, the conductive line disposed between a first dielectric layer and a second dielectric layer of the redistribution structure, wherein the conductive line is exposed at a sidewall of the redistribution structure.

5. The semiconductor device of claim 1, further comprising a second die embedded in the molding material and laterally spaced from the first die, wherein contact pads of the second die are electrically coupled to the redistribution structure.

6. The semiconductor device of claim 5, wherein sidewalls of the second die are free of a metal coating.

7. The semiconductor device of claim 6, wherein the first die and the second die have different functionalities.

8. The semiconductor device of claim 1, wherein the first metal coating further extends along the second side of the molding material.

9. The semiconductor device of claim 8, wherein the semiconductor device further comprises a dielectric layer between the first metal coating and the second metal coating.

10. The semiconductor device of claim 9, wherein sidewalls of the dielectric layer are aligned with respective sidewalls of the molding material.

11. A semiconductor device comprising:
a first die having a first die connector at a front side of the first die;
a molding material around sidewalls of the first die;
a conductive coating extending along and physically contacting the sidewalls of the first die, wherein the conductive coating has a first portion extending along a substrate of the first die and having a second portion extending along a dielectric layer of the first die, the dielectric layer surrounding the first die connectors at the front side of the first die, wherein the first portion and the second portion of the conductive coating comprise different materials;
a redistribution structure over the front side of the first die and over the molding material, wherein the redistribution structure comprises a first via, the first via having a first surface closest to the first die connector, the first surface of the first via contacting the first die connector and the conductive coating; and
a conductive layer extending along exterior surfaces of the molding material and along sidewalls of the redistribution structure.

12. The semiconductor device of claim 11, wherein the first die connector is electrically coupled to a ground contact pad of the first die, wherein the first die connector has an extension portion that extends from the ground contact pad toward the conductive coating.

13. The semiconductor device of claim 11, wherein the first via has an elongated shape in a plane parallel to the front side of the first die.

14. The semiconductor device of claim 11, wherein the conductive layer is electrically coupled to a conductive line of the redistribution structure, wherein the conductive line is exposed at a sidewall of the redistribution structure.

15. The semiconductor device of claim 14, further comprising a second die adjacent to the first die and surrounded by the molding material, wherein sidewalls of the second die are free of the conductive coating.

16. The semiconductor device of claim 11, further comprising a dielectric layer on a backside of the first die, the dielectric layer dispose between the conductive coating and the conductive layer.

17. The semiconductor device of claim 11, wherein the first surface of the first via physically contacts the first die connector and the conductive coating.

18. A semiconductor device comprising:
a first die embedded in a molding material, wherein a die connector of the first die is exposed by a first side of the molding material;
a first metal coating extending along and contacting at least sidewalls of the first die, wherein the first metal coating further extends along a second side of the molding material opposing the first side of the molding material;
a redistribution structure at the first side of the molding material;
a second metal coating extending along sidewalls of the molding material and along the second side of the molding material, wherein the first metal coating is between the first die and the second metal coating, wherein the first metal coating is electrically grounded by a via of the redistribution structure that electrically couples the first metal coating with the die connector, wherein the second metal coating is electrically coupled to a conductive line of the redistribution structure that is exposed by a sidewall of the redistribution structure, wherein the second metal coating is electrically grounded by the conductive line of the redistribution structure; and
a dielectric layer extending along the second side of the molding material, wherein the dielectric layer is disposed between the first metal coating and the second metal coating.

19. The semiconductor device of claim 18, wherein the first metal coating comprises a plurality of sublayers, each of the plurality of sublayers comprising a different material, and wherein the second metal coating has a single-layer structure.

20. The semiconductor device of claim 18, wherein the via of the redistribution structure has an elongated shape in a top view.

* * * * *